(12) United States Patent
Keshavarz Akhlaghi

(10) Patent No.: US 12,306,040 B2
(45) Date of Patent: May 20, 2025

(54) SUPERCONDUCTING SINGLE PHOTON DETECTOR WITH PHOTON NUMBER RESOLUTION

(71) Applicant: PHOTONIC INC., Coquitlam (CA)

(72) Inventor: Mohsen Keshavarz Akhlaghi, North Vancouver (CA)

(73) Assignee: PHOTONIC INC., Coquitlam (CA)

( * ) Notice: Subject to any disclaimer, the term of this patent is extended or adjusted under 35 U.S.C. 154(b) by 0 days.

(21) Appl. No.: 18/573,369

(22) PCT Filed: Jul. 22, 2022

(86) PCT No.: PCT/CA2022/051136
§ 371 (c)(1),
(2) Date: Dec. 21, 2023

(87) PCT Pub. No.: WO2023/000106
PCT Pub. Date: Jan. 26, 2023

(65) Prior Publication Data
US 2024/0361181 A1  Oct. 31, 2024

Related U.S. Application Data

(60) Provisional application No. 63/203,478, filed on Jul. 23, 2021.

(51) Int. Cl.
*G01J 1/44* (2006.01)
*G01J 1/02* (2006.01)
(Continued)

(52) U.S. Cl.
CPC ............. *G01J 1/44* (2013.01); *G01J 1/0252* (2013.01); *G01J 1/0425* (2013.01); *G01R 19/0092* (2013.01); *G01J 2001/442* (2013.01)

(58) Field of Classification Search
CPC .......... G01J 1/44; G01J 1/0252; G01J 1/0425; G01J 2001/442; G01R 19/0092
See application file for complete search history.

(56) References Cited

U.S. PATENT DOCUMENTS 11,385,099 B1 *  7/2022  Jafari-Salim .......... H10N 69/00
2010/0258160 A1 * 10/2010  Wang .............. H01L 31/035281
                                                                136/246
(Continued)

FOREIGN PATENT DOCUMENTS

EP          3764068 A1 *  1/2021   ............ G01J 1/4228
WO      2021110390 A2      6/2021

OTHER PUBLICATIONS

Akhlaghi, M.K. et al., "Nonlinearity in single photon detection: modeling and quantum tomography", Optics Express vol. 19, Issue 22, pp. 21305-21312 (2011); https://doi.org/10.1364/OE.19.021305.
Annunziata, A.J. et al., "Reset dynamics and latching in niobium superconducting nanowire single-photon detectors", Journal of Applied Physics 108, 084507 (2010); doi: 10.1063/1.3498809.
(Continued)

*Primary Examiner* — Georgia Y Epps
*Assistant Examiner* — Don J Williams
(74) *Attorney, Agent, or Firm* — Oyen Wiggs Green & Mutala LLP

(57) ABSTRACT

A single photon number resolving detector provides photon number resolution. The detector includes a waveguide which receives photons for detection. Nanowires are located in proximity to the waveguide. Each of the nanowires is connected in series with an electrically resistive component to provide a branch. Plural branches are electrically connected in parallel with one another. A power source is connectable to deliver an electrical current to flow through the branches. A current monitor is connected to monitor a magnitude of the total electrical current in the plurality of branches. At an operating temperature of the detector the nanowires are superconducting and each branch has an (Continued)

electrical time constant which is small enough to cause latching of the branch to a latched state when the nanowire of the branch absorbs a photon from the waveguide. The number of photons detected can be determined from the magnitude of the current which depends on the number of branches in the latched state.

21 Claims, 3 Drawing Sheets

(51) Int. Cl.
  *G01J 1/04* (2006.01)
  *G01R 19/00* (2006.01)

(56) References Cited

U.S. PATENT DOCUMENTS

| 2020/0256722 | A1 | 8/2020 | Najafi et al. |
| 2020/0333179 | A1 | 10/2020 | Chung et al. |
| 2020/0412164 | A1* | 12/2020 | Miller ................. H02J 7/00712 |

OTHER PUBLICATIONS

Divochiy, A. et al., "Superconducting nanowire photon number resolving detector at telecom wavelength", Conference on and Quantum Electronics and Laser Science Conference Lasers and Electro-Optics, QELS 2008, San Jose, CA, 2008.

Gol'tsman, G.N. et al., "Picosecond superconducting single-photon optical detector", Appl. Phys. Lett. 79, 705 (2001); https://doi.org/10.1063/1.1388868.

Jahanmirinejad, S. et al., "Photon-number resolving detector based on a series array of superconducting nanowires", Appl. Phys. Lett. 101, 072602 (2012); https://doi.org/10.1063/1.4746248.

Natarajan, C.M. et al., "Superconducting nanowire single-photon detectors: physics and applications", Superconduc. Sci. Technol. 25 (2012) 0630001.

Pernice, W.H.P. et al., "High-speed and high-efficiency travelling wave single-photon detectors embedded in nanophotonic circuits", Nature Communications, 3:1325, 2012.

Zhu, D. et al., "Resolving Photon Numbers Using a Superconducting Nanowire with Impedance-Matching Taper", Nano Letters 2020, vol. 20(5), 3858-3863.

Zhu, T. et al., "Ultrabroadband High Coupling Efficiency Fiber-to-Waveguide Coupler Using Si3N4/SiO2 Waveguides on Silicon", IEEE Photonics Journal, vol. 8, No. 5, pp. 1-12, Oct. 2016, Art No. 7102112, doi: 10.1109/JPHOT.2016.2600037.

* cited by examiner

SUPERCONDUCTING SINGLE PHOTON DETECTOR WITH PHOTON NUMBER RESOLUTION

CROSS-REFERENCE TO RELATED APPLICATION

This application claims priority from U.S. application No. 63/203,478 filed 23 Jul. 2021 and entitled SUPERCONDUCTING SINGLE PHOTON DETECTOR WITH PHOTON NUMBER RESOLUTION which is hereby incorporated herein by reference for all purposes. For purposes of the United States of America, this application claims the benefit under 35 U.S.C. § 119 of U.S. application No. 63/203,478 filed 23 Jul. 2021 and entitled SUPERCONDUCTING SINGLE PHOTON DETECTOR WITH PHOTON NUMBER RESOLUTION which is hereby incorporated herein by reference for all purposes.

FIELD

This invention relates to superconducting single photon detectors, in particular photon detectors capable of resolving a number of photons. The invention has example applications in quantum photonics and quantum computing.

BACKGROUND

There are various applications in which it is desirable to detect individual photons. These applications include quantum information technologies.

One type of photon detector is the superconducting nanowire single photon detector (SNSPD). SNSPDs offer high detection efficiency for visible and near infrared photons with high count rates, very small timing jitter, and low dark count rates. SNSPDs are described for example in G. N. Gol'tsman et al., *Picosecond superconducting single-photon optical detector*, Appl. Phys. Lett. 79, 705 (2001); https://doi.orq/10.1063/1.1388868.

A SNSPD comprises a nanowire located where it can absorb photons of interest and a source of electrical potential connected to pass a bias current through the superconducting nanowire. The nanowire typically follows a meandering path to enhance the likelihood that a photon will be absorbed.

In operation, with the nanowire at a temperature at which the nanowire is superconducting, the bias current is controlled to have a value such that an electrical current density in the nanowire is close to but below the superconducting critical current density of the nanowire. The superconducting critical current density is a current density threshold above which the nanowire becomes non-superconducting or "normal".

If the nanowire absorbs a photon (e.g. a photon having a wavelength in the visible or infrared part of the spectrum) the energy of the photon is delivered to the nanowire. This causes local heating of the nanowire which creates a hotspot. The nanowire is very thin so that the energy of the photon is sufficient to cause the material of the nanowire to become normal (non-superconducting) at the location of the hotspot. The part of the electrical bias current that would pass through the hotspot is then diverted around the hotspot. This increases the current density outside of the hotspot. The increased current density on either side of the hotspot can exceed the critical current density to cause a strip across the nanowire to become normal (electrically resisting). When this occurs, the bias current can cause additional energy to be dissipated in the resistive strip which in turn causes the hotspot to grow in size.

Each time a photon is absorbed by a superconducting nanowire, as described above, the voltage across the nanowire includes a pulse. Single photons may be detected by monitoring the voltage to detect such pulses. As long as heat from nanowire can be dissipated quickly enough to the environment, the nanowire once again becomes superconductive.

It would be desirable to have a photon detector capable of photon number resolution which shares at least some of the desirable properties of SNSPDs. There have been various attempts to provide such photon detectors. However, these have various disadvantages.

Mohsen K. Akhlaghi et al. *Nonlinearity in single photon detection: modeling and quantum tomography*, Optics Express Vol. 19, Issue 22, pp. 21305-21312 (2011) https://doi.org/10.1364/OE.19.021305 showed that voltage pulses caused by simultaneous absorption of multiple photons at the same nanowire sites in partially-biased SNSPDs can be analyzed to obtain some information on the number of photons absorbed. This very limited intrinsic photon number resolution (PNR) capability of SNSPDs which derives from nonlinear effects is not useful for typical practical applications.

One could imagine that the amplitude of a voltage pulse across a long nanowire in a SNSPD would depend on the number of photons absorbed at different locations along the nanowire (each of which may create its own resistive portion of the nanowire). However, obtaining sufficient voltage resolution requires a very high input impedance amplifier. Anthony J. Annunziata et al., *Reset dynamics and latching in niobium superconducting nanowire single-photon detectors* Journal of Applied Physics 108, 084507 (2010); doi: 10.1063/1.3498809 showed that using a readout circuit having high input impedance is not practical. For the nanowire to return to its superconductive state after a photon detection the nanowire must cool quickly relative to an electrical time constant $\tau_r = L_K/R_L$, where $L_K$ is the kinetic inductance of the nanowire, proportional to its length, and $R_L$ is the load resistance of the readout circuit. Otherwise the SNSPD will latch into a finite voltage state where it is not sensitive to photons.

Di Zhu et al., *Resolving Photon Numbers Using a Superconducting Nanowire with Impedance-Matching Taper*, Nano Lett. 2020, 20, 5, 3858-3863, Apr. 9, 2020. https://doi.orq/10.1021/acs.nanolett.0c00985 describes a photon detector comprising a SNSPD connected to an impedance matching transmission line and shows that the SNSPD had intrinsic photon number resolution. However, this device is only capable of detecting small numbers of photons and calibrating the device is a problem because detection probabilities are not independent of the temporal distribution of incoming photons.

Aleksander Divochiy et al., *Superconducting nanowire photon-number-resolving detector at telecommunication wavelengths*, Nature Photonics volume 2, pages 302-306 (2008) describes an array of meandering nanowire detectors electrically connected in parallel. S. Jahanmirinejad, *Photon-number resolving detector based on a series array of superconducting nanowires*, Appl. Phys. Lett. 101, 072602 (2012); https://doi.org/10.1063/1.4746248 discloses an array of nanowire detectors connected in series. These detectors exhibited PNR but the compact nanowire layout and high-frequency readout caused cross talk and scalability issues.

There remains a need for practical methods and apparatus capable of detecting photons with photon number resolution.

SUMMARY

The present application relates to apparatus for detecting photons and methods for detecting photons. The methods and apparatus have non-limiting application to detecting photons in quantum information systems.

One aspect of the invention provides apparatus in the form of a single photon detector which provides photon number resolution. Such a detector may be called a "PNRD" or photon number resolving detector. The detector includes a waveguide which receives photons for detection. Nanowires extend transversely across the waveguide. Each of the nanowires is connected in series with an electrically resistive component to provide a branch. The branches are connected in parallel with one another. For example, the branches may be electrically connected in parallel by first and second superconducting conductors that extend along opposing sides of the waveguide.

A power source is connectable to deliver an electrical current to flow through the branches. A current monitor is connected to monitor a magnitude of the electrical current. At an operating temperature of the detector the nanowires are superconducting and each branch has an electrical time constant which is small enough to cause latching of the branch to a latched state when the nanowire of the branch absorbs a photon.

In some embodiments branches of the PNRD are divided into plural groups with the branches of each of the groups connected in parallel. The PNRD comprises means for providing electrical current to each of the groups and means for monitoring the electrical current in each of the groups. For example, in some embodiments the PNRD comprises a power supply and current monitor for each of the plural groups.

In some embodiments the detector has in the range of 5 nanowires to 1000 or more nanowires. In some embodiments the spacing of the nanowires is in the range of ½ μm to 2 μm. The nanowires may or may not be equally spaced apart. In some embodiments adjacent ones of the nanowires are spaced apart by distances in the range of about 200 nm to about 4 μm. The nanowires may extend perpendicularly to the waveguide, may cross the waveguide at an angle, may extend transversely across the waveguide at different angles from one another. In some embodiments the nanowires are curved or follow a non-straight path adjacent to the waveguide. In some embodiments the nanowires are perpendicular to the waveguide or at angles in the range of +60 degrees to −60 degrees relative to perpendicular.

In some embodiments the nanowires include nanowires that are located on different sides of the waveguide and/or include nanowires formed to extend on different sides of the waveguide. For example, one or more of the multiple nanowires may be formed to wrap around two or three sides of the waveguide.

In some embodiments the waveguide has a length in the range of 0.1 mm to 6 mm. In some embodiments the waveguide has a width in the range of 0.2 μm to 3 μm.

In some embodiments the nanowires are evanescently coupled to the waveguide with sufficient strength that the probability that a photon propagating in the waveguide will be absorbed by one of the nanowires of the detector is greater than 65%. In some embodiments the each of the nanowires is evanescently coupled to the waveguide with sufficient weakness that the probability that a photon propagating in the waveguide will be absorbed by any individual one of the nanowires is less than 5% or less than 1% or less than 0.1%.

The nanowires comprise a superconducting material. In some embodiments the nanowires are made of one or a combination of niobium, niobium nitride, niobium-titanium nitride and tungsten silicide. In some embodiments the nanowires may have flattened cross sections with an aspect ratio (width:height) ranging from 5:1 to 20:1. In some embodiments the nanowires have widths in the range of 20 nm to 200 nm. In some embodiments the nanowires have thicknesses in the range of 4 nm to 10 nm. In some embodiments the nanowires have lengths in the range of less than 1000 nm to 5000 nm.

In some embodiments the critical currents of the nanowires are the same to within ±5%.

In some embodiments the waveguide is made of material selected from the group consisting of silicon, silicon nitride, glass, polymer, gallium arsenide, and aluminum gallium arsenide.

The apparatus may comprise an optical fiber that is coupled to an optical input of the waveguide by an optical coupling. In some embodiments the optical fiber is a single-mode optical fiber. In some embodiments the coupling comprises a tapered portion of the waveguide. In some embodiments the coupling includes a bandpass filter. In some embodiments the coupling, the waveguide and/or the optical fiber are wavelength selective.

In some embodiments the waveguide and the nanowires are supported on a substrate. The substrate may be formed with an alignment feature for the optical fiber and the optical fiber may be engaged with the alignment feature. In some embodiments the nanowires are located between the waveguide and the substrate.

In some embodiments the waveguide is configured to create a resonant structure.

The detection of photons may be increased within certain wavelength bands by patterning the waveguide with a resonant structure, incorporating an optical filter in the optical fiber, patterning an on-chip filter in the waveguide between the optical fiber taper and the first nanowire, adjusting the bias current, or adjusting the operating temperature. Patterning the waveguide may comprise etching holes in the waveguide, or fabricating the waveguide with undulating edges which provide suitable resonant characteristics.

In some embodiments the detector is wavelength specific. In some embodiments the coupling of the optical fiber to the waveguide is wavelength specific.

The electrically resistive components may for example comprise films of a metal, conductive polymer, carbon or doped semiconductor. In some embodiments the electrically resistive components have impedances in the range of about 0.1 kΩ to about 10 kΩ. In some embodiments the electrically resistive components comprise active components, such as field effect transistors (FETs) and/or devices that provide reactive impedances.

The apparatus may include or be used in conjunction with a refrigerator operable to cool the branches to temperatures at which the nanowires are superconductors. For example the detector may be operated at an operating temperature in the range of 1.5 K to 4.5 K. In some embodiments the operating temperature is less than half of the critical temperature for the nanowires (with the critical temperature expressed in Kelvins). In some embodiments the refrigerator is a cryogen-free refrigerator.

In some embodiments the power supply is an alternating current (AC) power supply. In some embodiments the power supply is operable to function as a pulse generator configured to output pulses separated by reset periods. In some embodiments the power source comprises a digital to analog converter (DAC) controlled by a controller and one or more filters which may comprise passive filters, and which filter an output of the DAC. In some embodiments the power source is located outside of a volume cooled to an operating temperature of the branches.

In some embodiments the current monitor comprises a current to voltage converter and a voltage monitor. The voltage monitor may, for example, comprise an analog to digital converter (ADC) connected to monitor a voltage output by the current to voltage converter. In some embodiments the current to voltage converter comprises one or more of a shunt resistor and a transimpedance amplifier.

In some embodiments the an electrical time constant, $\tau_r$, for a branch is given by $\tau_r = L_K/R_L$ (where $L_K$ is the kinetic inductance of the nanowire and $R_L$ is the load resistance of the power source).

A controller may be connected to obtain from the current monitor measurements of the electrical current at first and second times that are respectively before and after photons are delivered to the PNRD and to calculate a number N of the photons by processing a difference between the measurements of the electrical current.

In some embodiments the controller is configured to calculate the number of photons by computing $$N = \frac{I_{START} - I_{MEASURE}}{\Delta I}$$

where $I_{START}$ is the measured electrical current at the first time, $I_{MEASURE}$ is the measured electrical current at the second time and $\Delta I$ is given by: $\Delta I = I_{BIAS} - I_{LATCH}$ where $I_{BIAS}$ is a bias current for one of the nanowires in an unlatched state and $I_{LATCH}$ is a current in the one of the nanowires when the nanowire is in the latched state.

In some embodiments the controller is configured to obtain additional measurements of the electrical current at one or more times while photons are being detected and to calculate the number of photons based at least in part on the additional measurements.

In some embodiments the controller is configured to reset the PNRD by interrupting the supply of electrical current from the power source to the branches for a time long enough to allow all of the nanowires to cool to a temperature at which they are superconducting.

In some embodiments the controller is configured to calibrate the PNRD. The calibration, by the controller or otherwise may comprise:
a) Applying a train of bias/reset pulses to the branches and monitoring the bias current just before a reset, with no photons incident on the detector;
b) Gradually increasing the bias voltage and monitoring the resulting electrical current;
c) Determining a critical bias voltage;
d) Setting the bias voltage to a value smaller than the critical bias voltage and applying the train of bias/reset pulses;
e) Measuring a histogram of bias currents measured just before resets;
f) Sending calibrated weak laser pulses with mean photon number per pulse much less than 1;
g) Measure the histogram of measured bias current measured just before resets;
h) Gradually increasing the mean photon number of the laser pulses, and for each setting measuring the histogram;
i) Processing the histograms to identify well separated peaks and identifying threshold currents corresponding to different numbers of photons based on locations of the peaks.

Other aspects of the invention provide methods for detecting and counting photons. In some embodiments the methods comprise:
a) cooling a waveguide having multiple nanowires extending transversely across the waveguide at spaced apart locations to a temperature at which the nanowires are superconducting,
b) passing a bias current through each of the nanowires wherein the bias current is lower than a critical current for the nanowire,
c) directing at least one photon into the waveguide and allowing the photon to be evanescently absorbed by one of the nanowires,
d) upon the one of the nanowires absorbing the photon, latching the nanowire in a resistive state,
e) measuring an aggregate electrical current drawn by the nanowires and
f) processing the measured aggregate current to count the photon(s).

Where there are a plurality of photons, the method may direct the plurality of photons into the waveguide and allow the photons to be evanescently absorbed by different nanowires, thereby causing the corresponding nanowires to be latched in the resistive state.

In some embodiments the bias current in each branch is in the range of about 2 µA to about 30 µA. The bias current for each of the nanowires is less than the critical current. In some embodiments the bias current is at least 70% or 80% or 90% of the critical current. Bias current in individual nanowires may be adjusted by adjusting the values of the resistors connected in series with the nanowires. Resistors may be made by patterning a film of non-superconducting electrical conductor. The non-superconducting electrical conductor may, for example comprise a thin metal film, a film of conductive polymer of carbon or a doped semiconductor. Bias current in nanowires may be adjusted by adjusting the voltage providing the bias current.

Apparatus and methods as described herein may incorporate approaches to reducing errors and/or increasing detection efficiency. These may include one or more of:
reducing thermal cross talk between a nanowire and a waveguide, for example by increasing the spacing between the nanowire and the waveguide;
reducing electrical noise in voltage applied by a DAC or other power source by separating digital and analog ground connections and/or applying filtering;
measuring total current multiple times;
dividing the nanowires into a plurality of circuits, and measuring the total current of each circuit separately; and/or
adjusting the bias current.

Further aspects and example embodiments are illustrated in the accompanying drawings and/or described in the following description.

It is emphasized that the invention relates to all combinations of the above features, even if these are recited in different claims.

BRIEF DESCRIPTION OF THE DRAWINGS

The accompanying drawings illustrate non-limiting example embodiments of the invention.

DETAILED DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive sense.

Figure 1:
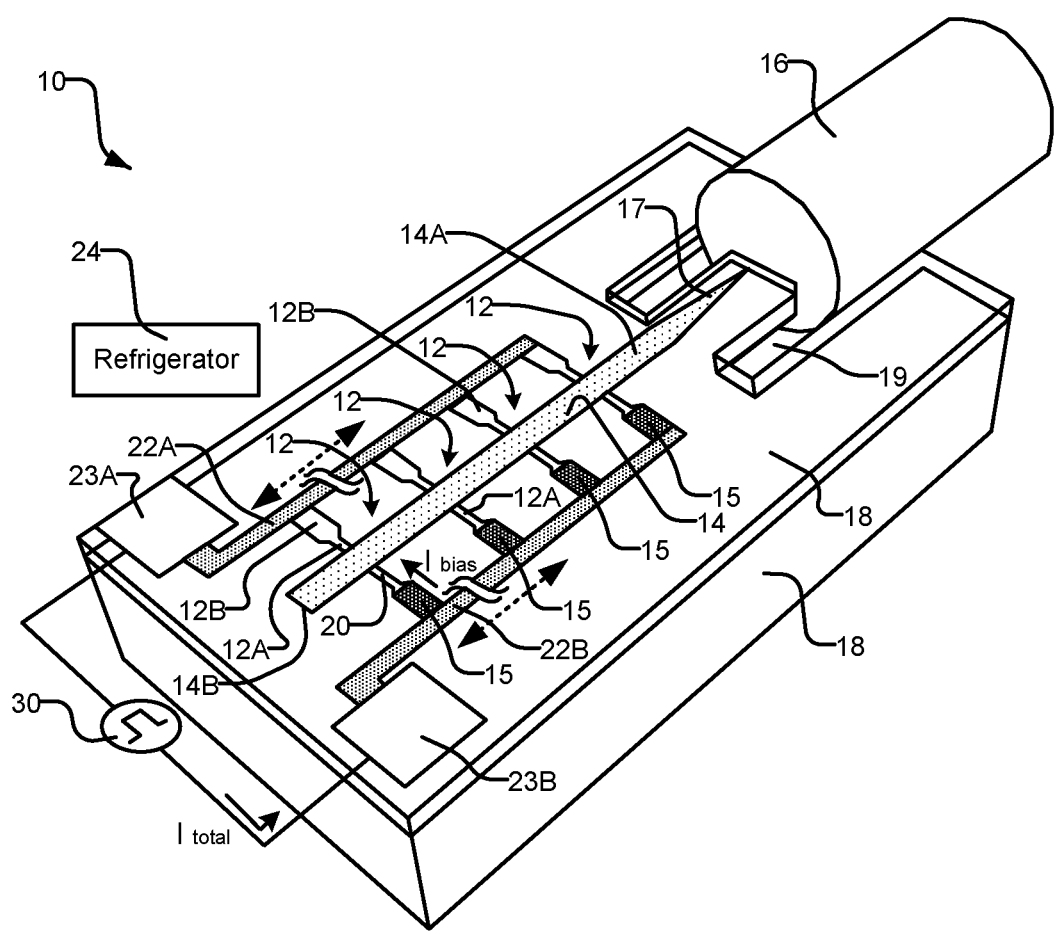
FIG. 1 is a schematic illustration of a photon detector according to an example embodiment.

FIG. 1 shows a photon-number-resolving detector 10 according to an example embodiment. Detector 10 comprises a plurality of nanowires 12 arranged adjacent to an optical waveguide 14. Waveguide 14 is made of a suitable light transmissive material such as $Si_3N_4$, for example. In some embodiments waveguide 14 is made of: silicon, silicon nitride, glass, polymer, gallium arsenide, aluminum gallium arsenide, or another material that is transparent at the target operating wavelength and has an index of refraction higher than surrounding media.

Waveguide 14 supports an optical mode. Photons traveling through the waveguide in the optical mode are internally reflected inside waveguide 14 and are evanescently coupled to nanowires 12.

Waveguide 14 has a length sufficient to accommodate a desired number of nanowires 12 with a desired spacing between nanowires 12. For example, the length of the array of nanowires 12 along the waveguide may be on the order of 1 mm. Waveguide 14 may have a length equal to the length of the array of nanowires 12 plus any extra length desired to support waveguide 14 and/or couple waveguide 14 to other optical structures. In some embodiments waveguide 14 has a length in the range of 0.1 mm to 6 mm.

In preferred embodiments, waveguide 14 has sufficient length that there is a high probability that any photon entering waveguide 14 at an optical input at a first end 14A of waveguide 14 will be absorbed by a nanowire 12 before the photon reaches a terminal end 14B of waveguide 14. In some embodiments the high probability is at least 65% (e.g. 65% or 70% or 80% or 90% or 95% or 99%). As discussed below, the strength of evanescent coupling to any individual nanowire 12 is high enough that there is a high probability that a photon entering waveguide 14 will be absorbed at one of nanowires 12 but the probability that the photon will be absorbed at any particular one of nanowires 12 is relatively low.

The strength of evanescent coupling of photons to nanowires 12 depends on factors such as the material and dimensions of waveguide 14, the material and dimensions of nanowires 12, the spacing between nanowires 12 and waveguide 14, properties of the medium between waveguide 14 and nanowires 12 and the geometries of nanowires 12 and waveguide 14. In designing a detector 10, these factors may be adjusted to provide a desired strength of evanescent coupling between photons in waveguide 14 and nanowires 12.

For example, to increase evanescent coupling to a nanowire 12 for photons having a target frequency one can make detector 10:
- using a material for nanowires 12 that absorbs photons of the target frequency more strongly;
- making nanowires 12 in a geometry that presents a larger area to waveguide 14 (e.g. making nanowires 12 wider and/or making nanowires 12 cross waveguide 14 at an angle; and/or
- positioning nanowires 12 closer to waveguide 14.

Evanescent coupling of photons at the target frequency to nanowires 12 may be reduced by making detector 10 to have the opposite of the above characteristics.

The strength of an evanescent coupling of a nanowire to a waveguide may be increased by increasing the dimensions of the nanowire such that the cross sectional area of the nanowire facing the waveguide is increased, selecting a material for the nanowire which absorbs photons at the target frequency more strongly than a currently selected material, decreasing the spacing between the nanowire and the waveguide, adjusting the angle of the nanowire relative to perpendicular to the waveguide such that the cross sectional area of the nanowire facing the waveguide is increased, providing resonant structuring of the waveguide and/or changing the geometry of the nanowire such that the cross sectional area of the nanowire facing the waveguide is increased.

The strength of an evanescent coupling of a nanowire to a waveguide may be reduced by decreasing the dimensions of the nanowire such that the cross sectional area of the nanowire facing the waveguide is increased, selecting a material for the nanowire which absorbs photons at the target frequency less strongly than a currently selected material, increasing the spacing between the nanowire and the waveguide, adjusting the angle of the nanowire relative to perpendicular to the waveguide such that the cross sectional area of the nanowire facing the waveguide is decreased, or changing the geometry of the nanowire such that the cross sectional area of the nanowire facing the waveguide is decreased.

Waveguide 14 may have a width, for example, on the order of 1 μm (e.g. 0.5 μm). Nanowires 12 are in close contact with waveguide 14 and extend across the width of waveguide 14.

Nanowires 12 are made of a material that is superconducting at an operating temperature of apparatus 10. Nanowires 12 may, for example, be made of niobium (Nb), niobium nitride (NbN), niobium-titanium nitride (NbTiN) and/or tungsten silicide (WSi).

Nanowires 12 may be flattened in cross section. In some embodiments an aspect ratio (width:height) of a cross section of nanowires 12 is in the range of 5:1 to 20:1. Here "height" is a dimension measured perpendicular to a surface of waveguide 14 to which the nanowire is adjacent and "width" is a dimension measured parallel to the surface of waveguide 14 and transverse to the nanowire 12.

In some embodiments nanowires 12 have widths on the order of about 100 nm. In some embodiments nanowires 12 have widths in the range of 20 to 200 nm. In some embodiments, nanowires 12 have widths of less than 150 nm.

As described in more detail below, if a nanowire 12 is too wide for given operating conditions then some photons absorbed by the nanowire 12 may not be detected. Optimum widths for nanowires 12 (i.e. widths such that there is a high probability that an absorbed photon will be detected) may be determined experimentally and/or by modelling. The optimum width can depend on the material of the nanowire 12, the operating temperature and the wavelength of the photons to be detected.

Nanowires 12 may have thicknesses (heights) on the order of about 4 nm to 10 nm for example. In some embodiments, nanowires 12 have thicknesses of less than 10 nm.

Nanowires 12 may be short. In some embodiments nanowires 12 have lengths that do not exceed 1000 nm or do not exceed 5000 nm, for example.

In the illustrated embodiment, some or all of nanowires 12 are formed by narrower portions 12A of a superconducting conductor 12B. Portions 12A are adjacent to waveguide 14. With this construction, for a given electrical current passing through conductor 12B, the current density in narrower portion 12A of conductor 12B that forms nanowire 12 is higher than it is in other parts of conductor 12B.

Nanowires 12 may extend across waveguide 14 in straight lines at desired angles (e.g. perpendicular) to waveguide 14. In some embodiments nanowires 12 extend at non perpendicular angles waveguide 14 (e.g. at an angle in the range of +60 degrees to −60 degrees relative to perpendicular).

Figure 1A:
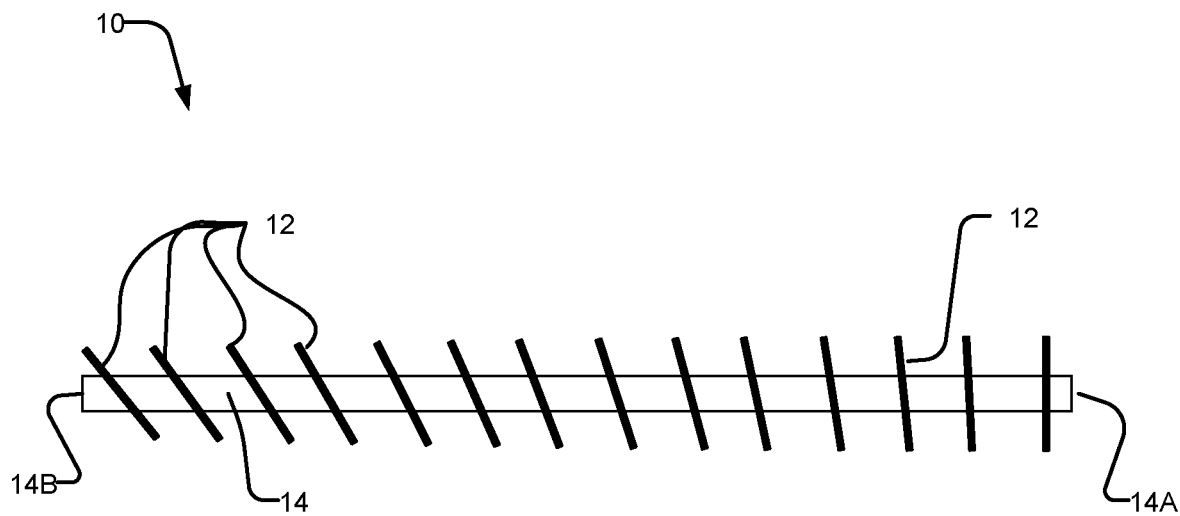
FIG. 1A is a schematic illustration showing an alternative arrangement of nanowires.

The angle of a nanowire 12 is one parameter that may be selected to achieve a desired coupling strength between photons of a target wavelength and the nanowire 12. In some embodiments different nanowires 12 in a detector 10 may cross waveguide 14 at different angles. For example, in a detector 14, a first nanowire 12 closest to optical inlet 14A may be perpendicular to waveguide 14. Each subsequent nanowire 12 along waveguide 14 may be slightly more angled. This is illustrated schematically in FIG. 1A. Other arrangements are also possible.

Nanowires 12 are spaced apart from adjacent nanowires 12 by a distance sufficient that there is essentially no thermal cross-talk between the adjacent nanowires 12. For example, adjacent nanowires 12 may be spaced apart by distances on the order of 1 µm (e.g. distances in the range of about 200 nm to about 4 µm).

Detector 10 may include a large number of nanowires 12. For example, detector 10 may include at least 5, at least 50, at least 100, at least 150, at least 200, at least 600, at least 800 or at least 950 nanowires 12. In an example embodiment detector 10 includes in the range of 500 to 2000 nanowires 12. In some embodiments detector 10 includes 1000 or more nanowires 12. There is no fixed upper limit to the number of nanowires 12 that may be included in detector 10.

Photons to be detected are coupled into waveguide 14. In the illustrated embodiment the photons are carried in an optical fiber 16 that is coupled into waveguide 14 by a suitable optical coupling 17. Optical fiber 16 may, for example be a single-mode optical fiber. Coupling 17 may, for example, comprise a taper in waveguide 14. In some embodiments waveguide 14 is coupled to optical fiber 16 in the manner described in T. Zhu et al., *Ultrabroadband High Coupling Efficiency Fiber-to-Waveguide Coupler Using $Si_3N_4/SiO_2$ Waveguides on Silicon*, IEEE Photonics Journal, vol. 8, no. 5, pp. 1-12, October 2016, Art no. 7102112, doi: 10.1109/JPHOT.2016.2600037., and fiber 16 delivers the photons to the desired mode of waveguide 14.

The manner in which waveguide 14 is terminated at the interface to fiber 16 or another optical structure that provides photons to be detected may be selected to achieve a desired coupling efficiency of photons to be counted from fiber 16 into waveguide 14. In general a high coupling efficiency for the photons to be counted is desirable. In some embodiments the coupling from fiber 16 into waveguide 14 is wavelength selective such that photons in a target wavelength band are coupled more strongly into waveguide 14 than photons outside of the target wavelength band.

A detector 10 may be optimized for maximum efficiency for photons within a target wavelength band and/or a target polarization state. The mode shape of the waveguide 14 and the strength of the evanescent coupling may depend on photon polarization. In some embodiments waveguide 14 and nanowires 12 are designed to optimize photon detection and reduce dark counts at a specific polarization. For example, a detector 10 may be optimized to detect photons of a specific polarization by adjusting design parameters of detector 10 such as the number of nanowires 12, spacing of nanowires 12, lengths of nanowires 12, type of optical fiber in waveguide 14, and/or design of the interface to waveguide 14. Some or all of these parameters may differ between detectors 10 optimized to detect photons having different polarizations and may also differ between detectors 10 optimized to detect photons having a specific polarization and a detector 10 optimized to efficiently detect photons of plural polarization states.

In FIG. 1, waveguide 14 and nanowires 12 are supported on a substrate 18. In this example, substrate 18 is formed with a feature such as a groove 19 and optical fiber 16 is engaged with the feature (e.g. engaged in groove 19) for alignment with waveguide 14. In some embodiments waveguide 14 is part of a network of photonic elements (e.g. elements such as waveguides, resonators, optical cavities, etc.) supported on substrate 18. The network of photonic elements may include qubits that emit photons which are coupled into waveguide 14 by the network of photonic elements and which may be detected by detector 10.

The physical arrangement of waveguide 14 and nanowires 12 may be varied. For example, in the illustrated embodiment, nanowires 12 are located "below" waveguide 14 (i.e. between waveguide 14 and substrate 18). Nanowires 12 may be additionally or alternatively located on other sides of waveguide 14. For example, nanowires 12 may be located "on top" of waveguide 14 (i.e. such that waveguide 14 is interposed between nanowires 12 and substrate 18). In some embodiments, nanowires 12 are formed to wrap around two or three sides of waveguide 14.

As another example, it is not required that nanowires 12 or waveguide 14 be straight. Either of these structures could be curved. For example, a detector 10 may be configured with a curved waveguide 14. In some such embodiments nanowires 12 radiate from a central pad. Also, individual nanowires 12 may be curved, U-shaped e.g. such that both ends of a nanowire 12 are on one side of waveguide 14) or other shapes. In general, nanowires 12 and waveguide 14 may have any shapes that can be achieved by a tool (e.g. a lithography system) used to make the detector 14 that are compatible with the operating principles described herein.

In some embodiments waveguide 14 is patterned to create a resonant structure. Such patterning may help to enhance the detection of photons within certain wavelength bands and reject photons in other wavelength bands. Resonant structures may modify exponential decay behaviour of photons travelling in waveguide 14 to allow nanowires which are further from optical fiber 16 to detect photons efficiently. Exponential decay of photons occurs as photons interact with nanowires 12 along waveguide 14. Resonant patterning may be fabricated for example using lithography methods. For example, a photonic crystal cavity could be made in the material of waveguide 14 or adjacent material by etching holes in the material, or waveguide 14 could be fabricated with undulating edges.

Resonant patterning of waveguide 14 may increase signal to noise ratio by increasing the probability that a nanowire 12 situated at a certain distance from optical fiber 16 will absorb and detect a photon without affecting the production of dark counts by the nanowire. Providing resonant structures in or adjacent to waveguide 14 may modify exponential decay behavior of photons in waveguide 14 so that nanowires 12 at different distances along waveguide 14 contribute more equally to photon detection than they otherwise would. This may enhance fidelity of photon detection particularly for a detector 10 having a smaller number of nanowire sections.

Resonant structures creating sharper resonance may also increase light-matter interaction thereby facilitating use of shorter nanowires 12 in detector 10. Shorter nanowires may provide for ease of manufacturing as well as faster and quieter detection of photons.

Each of nanowires 12 is connected in series with a resistor 15. The combination of one nanowire 12 and the corresponding resistor 15 may be called a "branch" 20. Detector 10 includes first and second conductors 22A and 22B. Branches 20 are each coupled between conductors 22A and 22B. Branches 20 are therefore mutually connected in parallel by conductors 22A, 22B. Conductors 22A and 22B may comprise superconducting traces, wires, conductors, strips etc.

Resistors 15 have electrical impedances (e.g. resistances) at the operating temperature such that, when a selected electrical potential (voltage) is applied between conductors 22A and 22B a bias current flows through each of nanowires 12. The bias current has a magnitude that is less than a critical current of the nanowire 12. Ideally the bias current is only slightly less than the critical current for the nanowire 12. Selecting lower bias currents reduces the detection efficiency for photons but can also reduce 'dark counts'. Dark counts are unintentional counts that occur when a stray photon is absorbed by the nanowire 12 or due to non-ideal internal dynamics of the nanowire 12.

In some embodiments the bias current in each branch 20 is in the range of about 2 μA to about 30 μA.

Resistors 15 are sufficiently thermally isolated from nanowires 12 that heat resulting from energy dissipated in resistors 15 does not significantly affect the temperatures of nanowires 12. The thermal isolation may, for example, be provided by locating resistors 15 far enough away from nanowires 12. This may be done while keeping the conductors which make up each branch 20 short enough to avoid excessive pickup of electrical noise (e.g. arising from parasitic electrical effects such as stray capacitance and inductance).

Resistors 15 may, for example, be made by patterning a film of a "normal" (i.e. non-superconductive) electrical conductor (e.g. a thin metal film, a film of a conductive polymer of carbon or a doped semiconductor). Resistors 15 are dimensioned to provide a desired electrical resistance at the operating temperature of detector 10. Resistors 15 may have any suitable geometry (e.g. elongated rectangles, meandering lines etc.).

In some embodiments resistors 15 have impedances in the range of about 0.1 kΩ to about 10 kΩ.

In some embodiments resistors 15 are provided by active components such as field effect transistors (FETs). The active components may be controlled to adjust bias current for the corresponding branch 20. Active components may, for example, be formed in substrate 18 by any known semiconductor fabrication technologies.

In some embodiments the bias voltage is an alternating current (AC) voltage. In such embodiments, resistors 15 may comprise or consist of devices that provide reactive impedances (e.g. capacitors and/or inductors) which limit the maximum current to be below the critical current for the nanowire 12 of the branch 20.

In an ideal case, each nanowire 12 has the same critical current. In such an ideal case, achieving a bias current slightly less than the critical current for each nanowire 12 may be achieved by making each resistor 15 to provide the same resistance.

In some embodiments the critical currents of nanowires 12 are close enough to being the same that the same design of resistor 15 will provide an acceptable bias current in each nanowire 12 (i.e. a bias current that is less than the critical current for the nanowire and within a desired range of the critical current for the nanowire). For example, a detector 10 may be made so that the bias current for each nanowire 12 is less than the critical current and at least 40% or 50% or 60% or 70% or 80% or 90% or 95% or 98% of the critical current.

In some embodiments the bias currents in individual nanowires are tuned. This may be achieved, for example, by adjusting values of resistors 15 (e.g. by removing material from individual as-manufactured resistors 15 by laser ablation or other suitable technique to decrease the bias current and/or by controlling an active component that provides all or part of the resistor 15).

Detector 10 includes a refrigerator 24 which is operable to cool branches 20 and conductors 22A and 22B to temperatures at which they are superconductors (e.g. liquid helium temperature or temperatures of up to a few Kelvin). For example, refrigerator 24 may be connected to cool the entire chip shown in FIG. 1. Substrate 18 may have a low enough thermal resistance to carry heat away from components of detector 10 where heat is generated (e.g. nanowires 12 which absorb photons or resistors 15 which dissipate energy in the form of ohmic (12R) losses). Good thermal conductivity of substrate 18 may, for example, be achieved by making substrate 18 out of materials such as silicon or sapphire.

In some embodiments refrigerator 24 is a cryogen-free refrigerator. In some embodiments the temperature of operation of detector 10 exceeds 1.5 K. In some embodiments detector 10 is maintained at a temperature of 4.2K or less with lower temperatures being desirable for better detection. In some embodiments the operating temperature of detector 10 (in Kelvin) is less than half of the critical temperature for nanowires 12.

In operation, nanowires 12 are superconducting. A power source 30 is connected to apply a potential difference between conductors 22A and 22B so that each branch 20 carries a bias current. Power source 30 may comprise a variable voltage power source. The voltage may be adjusted to provide suitable bias current $I_{BIAS}$ in each branch 20.

Figure 2A:
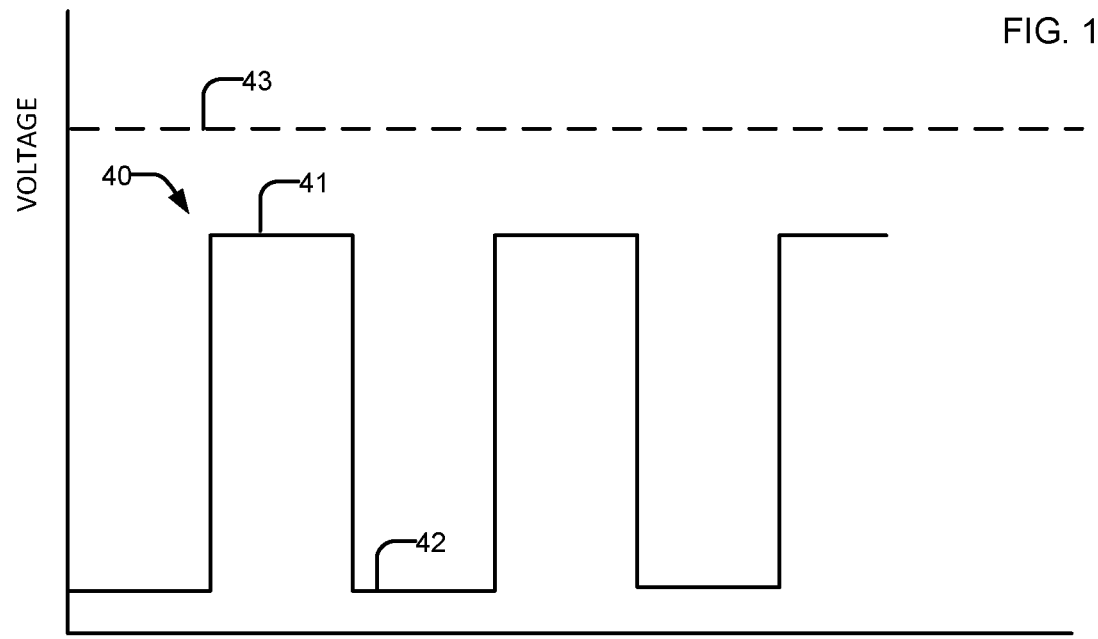
FIG. 2A shows an example waveform for a power supply for a photon detector.
Figure 2B:
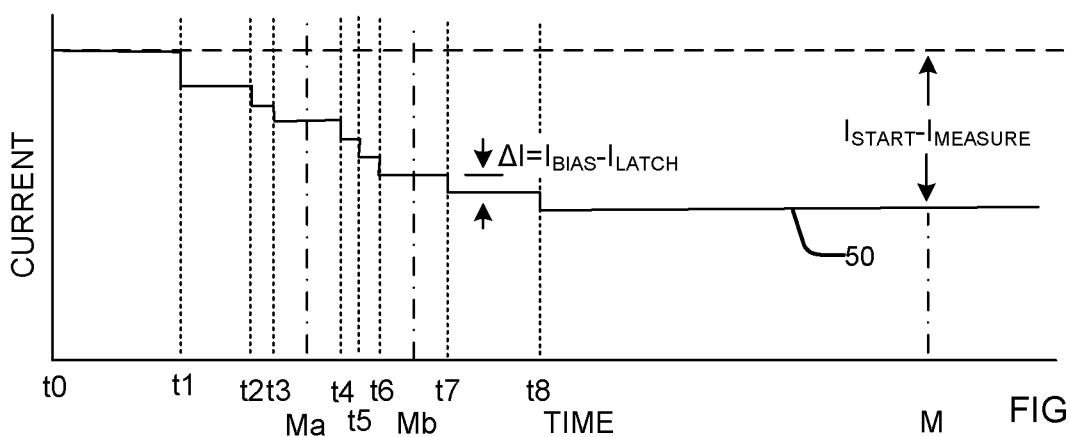
FIG. 2B is a graph showing a schematic example of total current as a function of time for a photon detector if the type shown in FIG. 1.
Figure 2:
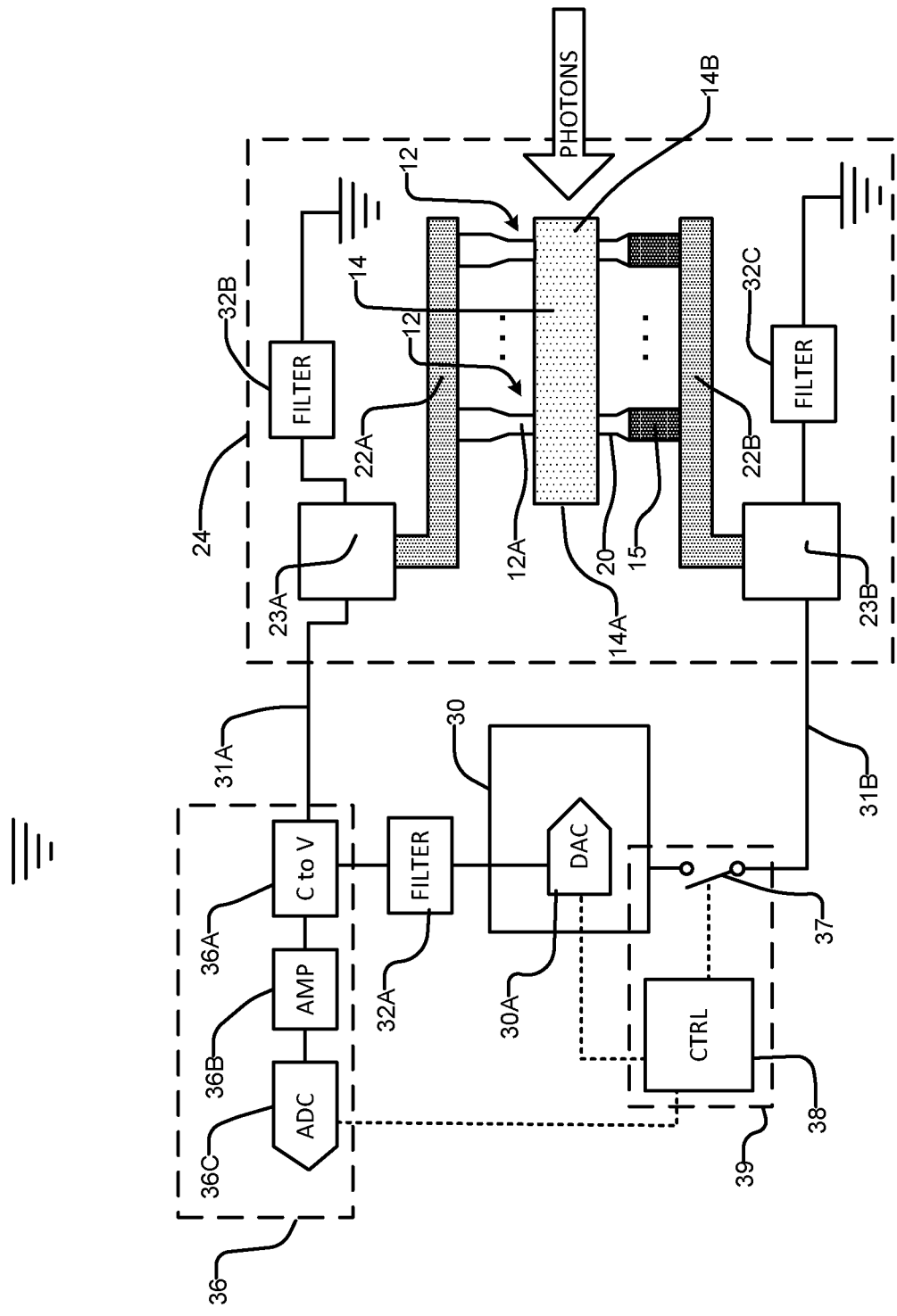
FIG. 2 is an electrical schematic showing an example equivalent electrical circuit for apparatus according to an example embodiment.

FIG. 2 illustrates an example case where power source 30 comprises a digital to analog converter (DAC) 30A controlled by a controller 38 to output a suitable voltage. One or more filters may be connected to filter the output of DAC 30A that is applied between conductors 22A and 22B. In some embodiments the filters are passive filters.

To minimize electrical noise in the voltage applied by DAC 30A between conductors 22, DAC 30A may have separate digital and analog ground connections which are connected to separate ground conductors. The filters may include filters that operate to reduce transmission of any electronic noise in the analog ground and analog output of DAC 30A to conductors 22A and 22B. In some embodiments the filters include filters that operate to reduce or eliminate ringing or overshoot of pulses generated by controlling DAC 30A. The filters may include low-pass and/or band-pass filters. FIG. 2 shows example filters 32A, 32B and 32C. In some embodiments at least some of the filters operate at cryogenic temperatures (e.g. filters 32B and 32C in FIG. 2).

Power source 30 is optionally located outside of the volume cooled by refrigerator 24. For example power source 30 may be at room temperature. Power source 30 may be connected to conductors 22A and 22B by an electrical connection 31 which may provide a low frequency (MHz range) electrical connection. For example, electrical connection 31 may comprise electrical conductors 31A, 31B that are respectively electrically connected to conductors 22A and 22B at pads 23A and 23B. Electrical connection 31 may, for example comprise a coaxial cable.

The magnitude of the bias current in each branch 20 depends on the voltage applied by power source 30 and the resistance provided by the resistor 15 in the branch 20. These parameters are selected or controlled to maintain the bias current at a level that is below but close to the critical current of superconducting nanowires 12. In some embodiments the applied bias current is at least 40% or at least 60% or at least 80% or at least 90% of the critical current of nanowires 12. In some embodiments the bias current is in the range of 40% to 90% of the critical current of nanowires 12.

Any photons traveling along waveguide 14 are weakly evanescently coupled to nanowires 12. The likelihood that any individual nanowire 12 will absorb any individual photon is low. For example, the probability of absorption of a particular photon by any particular nanowire 12 may be less than 2% or less than 1% or less than %% or less than 0.1%. However, with a large number of nanowires 12 the probability that any individual photon propagating in waveguide 14 will be absorbed by one of nanowires 12 can be high (e.g. at least 80%, at least 90%, at least 95%, at least 98%, or at least 99%).

Since the probability that any particular nanowire 12 will absorb a photon is low, the probability that a nanowire 12 will absorb two or more photons in one measurement cycle can be negligibly small for reasonable numbers of photons (e.g. for 10 or fewer or 15 or fewer or 20 or fewer or 25 or fewer photons at a time).

Power source 30 may be operated at a constant voltage. The current drawn from power source 30 in the absence of detected photons is therefore equal to the sum of the bias currents of all branches 20.

FIG. 2 shows an example current measuring circuit 36 operable to measure the current being drawn from power source 30. Circuit 36 may, for example, comprise a current to voltage converter 36A and a voltage monitor 36C such as an analog to digital converter (ADC) connected to monitor a voltage output by current to voltage converter 36A. The analog to digital converter has sufficient resolution to resolve the different current levels that correspond to different numbers of photons being absorbed. For example, voltage monitor 36C may include an ADC having an 8-12- or 16-bit digital output. Current to voltage converter 36A may include a low noise amplifier 36B. Current to voltage converter 36A may, for example include a shunt resistor, a transimpedance amplifier or the like.

Each branch 20 is designed and operated so that if a photon is absorbed by the branch 20 then the energy from the photon will cause the branch 20 to latch to a state in which all or a portion of the corresponding nanowire 12 are resistive (non-superconducting) upon absorption of the photon. This may be achieved, for example by making nanowires 12 short, thereby causing the electrical time constant $\tau_r = L_K/R_L$ (where $L_K$ is the kinetic inductance of the nanowire and $R_L$ is the load resistance of power source 30) to be small relative to the time required for the nanowire to dissipate heat resulting directly or indirectly from absorbing the photon. The latching may occur, for example when absorption of a photon causes a portion of a nanowire 12 to become electrically resistive and ohmic (12R) losses from electrical current flowing through the non-superconducting nanowire 12 subsequently prevent the nanowire 12 from cooling sufficiently to resume being superconducting.

In some embodiments, when a nanowire 12 is in the latched state, a large proportion of the nanowire 12 is non-superconducting. For example, at least 70% or 80% or 90% or 99% of the nanowire 12 may be non-superconducting in the latched state.

A branch 20 that has absorbed a photon and is in the latched resistive state will carry a current $I_{LATCH}$ that is less than the bias current $I_{BIAS}$. Therefore, the total current supplied by the power source after absorption of a pulse of photons will be reduced in proportion to the number of branches 20 that have absorbed one of the photons (which if each of the photons is absorbed by a different one of nanowires 12 will equal the number of photons in the pulse of photons). This current may be measured (e.g. by current measuring circuit 36) and used as a readout signal.

FIG. 2B is a graph which includes a curve 50 showing total current as a function of time. Measurement starts at time t0. Photons are captured at times t1 to t8. Each time a photon is captured the total current drops by an amount $\Delta I = I_{BIAS} - I_{LATCH}$ where $I_{BIAS}$ is the bias current for one nanowire 12 and $I_{LATCH}$ is the current for the nanowire 12 in its latched state. Since nanowires 12 remain latched until reset the total current may be measured any time after the photons are captured. The number of captured photons N may be determined by:

$$N = \frac{I_{START} - I_{MEASURE}}{\Delta I}$$

where $I_{START}$ is the total current before any photons have been absorbed by nanowires 12, and $I_{MEASURE}$ is the current measured after the photons have been absorbed by nanowires 12.

One limit to the number of photons that can be accurately detected by a detector 10 arises from the fact that $\Delta I = I_{BIAS} - I_{LATCH}$ may not be identical for all branches 20 and also the uncertainty associated with determination of $I_{START} - I_{MEASURE}$. Especially where a large number of photons are absorbed there could be cases where the value of N has an uncertainty of one or more.

The above limit may be addressed in various ways including:
  Measuring total current more than once; and/or.
  Dividing the nanowires 12 of detector 10 into plural separate circuits which each include a plurality of the nanowires 12 and measuring total current separately for each of the separate circuits.

For example, in a detector 10 that includes a number M of nanowires 12 the nanowires 12 may be grouped into 2 or 3 or more circuits and the total current may be measured separately for each of the circuits. In some embodiments total current may be measured at a rate high enough to provide a time resolved count of arriving photons. For example, measurements may be made at a rate sufficient that it is likely that not more than a few photons are likely to be absorbed by nanowires 12 between any two adjacent measurements. If the optical pulse that comprises the photons is wide enough and readout is fast enough, then individual latching events may be resolved.

FIG. 2B illustrates an example of measuring total current at one or more times while photons are being detected in addition to a measurement made after the photons have been absorbed in nanowires 12. FIG. 2B shows an example in which measurements of total current are made at times Ma and/or Mb in addition to the measurement at time M. These measurements may be used to achieve a measurement of N with a lower uncertainty than could be achieved by a single measurement made at time M.

In some embodiments the nanowires are grouped into circuits based on distance from end 14A of waveguide 14. For example the first circuit may include a first group of nanowires 12 closest to end 14A, the second circuit may include a group of nanowires 12 adjacent to the first group and so on. In some embodiments the groups closest to end 14A include fewer nanowires 12 than groups located farther from end 14A.

The latched branches 20 may be reset so that the corresponding nanowires 12 are once again superconducting by interrupting the supply of electrical current from power source 30 for a time long enough to allow all of nanowires 12 to cool to a temperature at which they are again superconducting. For example, heat may be carried away from the latched nanowires 12 through substrate 18.

A detector 10 may, for example be reset by temporarily reducing the bias voltage to zero or another low value by applying a power supply 30 that functions as a pulse generator. The pulse generator may, for example output a waveform 40 as shown in FIG. 2A which comprises pulses 41 separated by reset periods 42. Pulses 41 have amplitudes below a level 43 corresponding to the critical current in nanowires 12. The amplitude of waveform 40 in reset periods 42 is zero or low enough that resistive heating in latched nanowires is small enough that the latched nanowires can cool to temperatures at which they are again superconducting by the end of the reset period 42. It is not mandatory that pulses 41 be evenly spaced apart. In some embodiments pulses 41 are triggered to coincide with events which may emit photons to be counted by detector 10. It is not mandatory that pulses 41 be all of the same duration. Pulses 41 should be long enough to allow photons of interest to be detected and the total current can be measured.

A pulse generator may be provided, for example by controlling the output voltage of DAC 30A by a controller 38 to produce a waveform like waveform 40. Alternative circuits may be used for power supply 30. For example, a waveform to drive detector 10 may be generated by an analog pulse generator circuit or by switching an output of a fixed voltage power supply with a switching circuit.

In some embodiments the reset periods can be short. For example the time required for resetting latched nanowires 12 may be very short (e.g. <10 ns) such that the nanowires 12 will be reset even if the reset periods have durations not exceeding 10 microseconds or not exceeding 10 nanoseconds. The practical minimum duration of reset periods 42 depends on various factors including the thermal conductivity of the connection between nanowires 12 and a cold part of detector 10 that serves as a heat sink to cool nanowires 12 and electrical characteristics of power supply 30, conductors 31 and detector 10.

Controller 38 may provide additional functions such as: processing readout signals to yield photon counts; calibrating detector 10; setting up detector 10 to provide a suitable base current; triggering reset of detector 10.

To calibrate detector 10, controller 38 may be configured to perform the steps of:
1—Apply a train of bias/reset pulses to detector 10, and monitor the bias current just before a reset, with no photons incident on detector 10.
2—Gradually increase the bias voltage and monitor current. The current should go up linearly at lower bias currents, and then the slope-of-change of the current or the current itself should decrease. The onset of this change indicates the bias voltage corresponding to the critical current in nanowires 12. This may be called the critical bias voltage.
3—Set the bias to a value smaller than the critical bias voltage and apply the train of bias/reset.
4—Measure the histogram of bias current measured just before reset.
5—Send a calibrated weak laser pulse with mean photon number per pulse much less than 1.
6—Measure the histogram of measured bias current measured just before reset.
7—Gradually increase the mean photon number, and for each setting measure the histogram.
8—The set of histograms should show well separated peaks. The vertical lines separating the peaks make a set of thresholds each corresponding to the number of photons detected.

Comparing the known statistics of photons in the calibrated laser pulses, with statistics of measured photons would allow the determination of detection parameters such as detection efficiency and detection uncertainties. Repeating the procedure with different bias currents and different photon wavelengths will give other sets of thresholds and performance metrics.

Controller 38 may be configured to store calibration information determined by the calibration procedure in a data store. For example, the calibration information may be stored in a look up table.

It can be appreciated that apparatus as described herein can operate to "store" multiple single photon detection events in the form of latched branches 20. The number of latched branches 20 may be determined at any time by reading out a current supplied by power source 30. Branches 20 may then be reset as described herein. The storage functionality makes high-frequency readout unnecessary (although high frequency readout may be performed in some embodiments). Reading the output of detector 10 at lower frequencies (e.g. once after each pulse of photons is delivered to waveguide 14) helps to remove electrical cross talk as a source of error. In some embodiments, detector 10 is operable at a repetition rate of at least 1 MHz.

In some embodiments the current flowing in detector 10 is sampled to detect changes in the current attributable to absorption of individual photons. The sampling rate may be high enough to determine the time of detection of individual photons to a desired level of precision. This mode of operation may provide information on the shape of an optical pulse or may be useful to reduce accumulated uncertainty.

The design of detector 10 also facilitates relatively large distances between adjacent nanowires 12. This feature helps to avoid thermal cross talk between different nanowires 12 as a source of error.

In some embodiments, detector 10 as described herein is applied to count photons, including photons that arrive at waveguide 14 in pulses with high confidence (e.g. a confidence level of at least 80%, at least 85% at least 90% or at least 95%).

In some embodiments waveguide 14 is not strongly wavelength selective such that detector 10 is effective for counting photons that have wavelengths in a reasonably wide range. For example, detector 10 according to some embodiments is operable to count photons having wavelengths of 800 nm as well as photons having wavelengths of 1550 nm (e.g. detector 10 may have a detection efficiency of 90% or more for photons having wavelengths in the ranges 1550 nm±20 nm and 800 nm±10 nm or wavelengths in the ranges 800±50 nm and 1550±100 nm.). In some embodiments, detector 10 as described herein is operable to count photons having wavelengths in the range of about 5000 nm to about 400 nm or less.

In some embodiments, waveguide 14 is made more wavelength selective by incorporating an optical filter in optical fiber 16 and/or by patterning an on-chip filter in the portion of waveguide 14 between optical fiber 16 taper and the first nanowire 12. Such optical filters may be effective at rejecting stray photons and may help increase signal to noise (i.e. reduce unwanted photons delivered to the nanowires).

The wavelength range to which detector 10 is most sensitive may be adjusted within a small range by altering the bias current and operating temperature.

To facilitate wideband operation, each of waveguide 14, optical fiber 16, connector 17 and nanowires 12 may be wideband (i.e. waveguide 14, optical fiber 16, and connector 17 may efficiently transmit photons having wavelengths in the desired bands and nanowires 12 may collectively efficiently absorb photons in the desired bands by evanescent absorption). In some embodiments of wideband operation fiber 16 is selected for optimum performance at a target wavelength, and/or coupling mechanism 17 is optimized for a target wavelength.

To facilitate non-wideband operation waveguide 14 may be further patterned to manipulate light. For example, holes may be etched into sections of waveguide 14 that are between adjacent nanowires 12. The number, locations and dimensions of the holes may be engineered to tailor the interaction of light in waveguide 14 with nanowires 12. Another example way to achieve non-wideband operation is to form waveguide 14 to have a width that is periodically modulated to filter light or to slow its propagation. Such structures typically provide a much narrower useful bandwidth.

A single substrate 18 may optionally carry a plurality of photon counting detectors as described herein. For example a 20×20 mm chip may host up to hundreds of such detectors.

In designing a detector 10 and its operating conditions, the material of nanowires 12, operation wavelength and operation temperature may be taken as basic design parameters. From these, the maximum width for nanowires 12 for efficient photon detection may be determined. The material and dimensions of waveguide 14, and the nanowire 12 to waveguide 14 spacing, may then be designed based upon the nanowire 12 width to obtain the desired coupling strength of nanowire 12 to the photons in waveguide 14.

Interpretation of Terms

Unless the context clearly requires otherwise, throughout the description and the claims:

"comprise", "comprising", and the like are to be construed in an inclusive sense, as opposed to an exclusive or exhaustive sense; that is to say, in the sense of "including, but not limited to";

"connected", "coupled", or any variant thereof, means any connection or coupling, either direct or indirect, between two or more elements; the coupling or connection between the elements can be physical, logical, or a combination thereof;

"herein", "above", "below", and words of similar import, when used to describe this specification, shall refer to this specification as a whole, and not to any particular portions of this specification;

"or", in reference to a list of two or more items, covers all of the following interpretations of the word: any of the items in the list, all of the items in the list, and any combination of the items in the list;

the singular forms "a", "an", and "the" also include the meaning of any appropriate plural forms.

Words that indicate directions such as "vertical", "transverse", "horizontal", "upward", "downward", "forward", "backward", "inward", "outward", "left", "right", "front", "back", "top", "bottom", "below", "above", "under", and the like, used in this description and any accompanying claims (where present), depend on the specific orientation of the apparatus described and illustrated. The subject matter described herein may assume various alternative orientations. Accordingly, these directional terms are not strictly defined and should not be interpreted narrowly.

In some embodiments, apparatus as described herein includes a controller. A controller may be implemented using specifically designed hardware, configurable hardware, programmable data processors configured by the provision of software (which may optionally comprise "firmware") capable of executing on the data processors, special purpose computers or data processors that are specifically programmed, configured, or constructed to perform one or more steps in a method as explained in detail herein and/or combinations of two or more of these. Examples of specifically designed hardware are: logic circuits, application-specific integrated circuits ("ASICs"), large scale integrated circuits ("LSIs"), very large scale integrated circuits ("VLSIs"), and the like. Examples of configurable hardware are: one or more programmable logic devices such as programmable array logic ("PALs"), programmable logic arrays ("PLAs"), and field programmable gate arrays ("FPGAs"). Examples of programmable data processors are: microprocessors, digital signal processors ("DSPs"), embedded processors, graphics processors, math co-processors, general purpose computers, server computers, cloud computers, mainframe computers, computer workstations, and the like. For example, one or more data processors in a control circuit for a device may implement methods as described herein by executing software instructions in a program memory accessible to the processors.

Some aspects of the invention may also be provided in the form of a program product. The program product may comprise any non-transitory medium which carries a set of computer-readable instructions which, when executed by a data processor, cause the data processor to execute a method of the invention (e.g. a method for controlling apparatus as described herein and/or a method for calibrating apparatus as described herein and/or a method for processing readouts from apparatus as described herein. Program products according to the invention may be in any of a wide variety of forms. The program product may comprise, for example, non-transitory media such as magnetic data storage media including floppy diskettes, hard disk drives, optical data storage media including CD ROMs, DVDs, electronic data storage media including ROMs, flash RAM, EPROMs, hardwired or preprogrammed chips (e.g., EEPROM semiconductor chips), nanotechnology memory, or the like. The computer-readable signals on the program product may optionally be compressed or encrypted.

In some embodiments, certain aspects of the invention are implemented in software. For greater clarity, "software" includes any instructions executed on a processor, and may include (but is not limited to) firmware, resident software, microcode, and the like. Both processing hardware and software may be centralized or distributed (or a combination thereof), in whole or in part, as known to those skilled in the art. For example, software and other modules may be accessible via local memory, via a network, via a browser or other application in a distributed computing context, or via other means suitable for the purposes described above.

Where a component (e.g. a software module, processor, waveguide, resistor, power source, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Specific examples of systems, methods and apparatus have been described herein for purposes of illustration. These are only examples. The technology provided herein can be applied to systems other than the example systems described above. Many alterations, modifications, additions, omissions, and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

Various features are described herein as being present in "some embodiments". Such features are not mandatory and may not be present in all embodiments. Embodiments of the invention may include zero, any one or any combination of two or more of such features. All possible combinations of such features are contemplated by this disclosure even where such features are shown in different drawings and/or described in different sections or paragraphs. This is limited only to the extent that certain ones of such features are incompatible with other ones of such features in the sense that it would be impossible for a person of ordinary skill in the art to construct a practical embodiment that combines such incompatible features. Consequently, the description that "some embodiments" possess feature A and "some embodiments" possess feature B should be interpreted as an express indication that the inventors also contemplate embodiments which combine features A and B (unless the description states otherwise or features A and B are fundamentally incompatible).

It is therefore intended that the following appended claims and claims hereafter introduced are interpreted to include all such modifications, permutations, additions, omissions, and sub-combinations as may reasonably be inferred. The scope of the claims should not be limited by the preferred embodiments set forth in the examples, but should be given the broadest interpretation consistent with the description as a whole.

What is claimed is:

1. A photon number resolving detector (PNRD) comprising:
   a waveguide having an optical input connected to receive photons for detection;
   multiple nanowires extending transversely across the waveguide at spaced apart locations, each of the nanowires comprising a material that is superconducting at an operating temperature of the PNRD, each of the nanowires connected in series with an electrically resistive component to provide a branch, the branches electrically connected in parallel with one another;
   wherein the PNRD is connectable to:
   a power source to apply a voltage across the branches, and;
   a current monitor to monitor an electrical current drawn from the power source by the branches;
   and wherein, at the operating temperature, an electrical time constant of the nanowire is small enough to cause latching to a latched state when the nanowire absorbs a photon.

2. The PNRD according to claim 1, wherein different ones of the multiple nanowires extend transversely across the waveguide at different angles.

3. The PNRD according to claim 1 wherein evanescent couplings between the multiple nanowires and the waveguide are:
   sufficiently strong that a probability that any photon entering the waveguide at the optical input will be absorbed by one of the multiple nanowires is at least 65%, and
   sufficiently weak that a probability that any photon entering the waveguide at the optical input will be absorbed by any particular one of the multiple nanowires is less than 5%.

4. The PNRD according to claim 1, wherein the multiple nanowires have lengths that do not exceed 1000 nm.

5. The PNRD according to claim 1, wherein the nanowires extend across the waveguide in straight lines perpendicular to the waveguide or at angles in the range of +60 degrees to -60 degrees relative to perpendicular.

6. The PNRD according to claim 1, comprising a wavelength selective optical fiber that is coupled to the optical input of the waveguide by an optical coupling.

7. The PNRD according to claim 1, comprising optical fiber that is coupled to the optical input of the waveguide by an optical coupling, wherein the optical coupling comprises a bandpass filter.

8. The PNRD according to claim 1, wherein the waveguide is patterned to create a resonant structure.

9. The PNRD according to claim 1, wherein the electrically resistive components are thermally isolated from the nanowires.

10. The PNRD according to claim 1, wherein the branches are connected in parallel by first and second superconducting conductors that extend along opposing sides of the waveguide.

11. The PNRD according to claim 1, comprising the power source, wherein the power source is an alternating current (AC) power supply and the electrically resistive components comprise devices that provide reactive impedances.

12. The PNRD according to claim 1, comprising the power source, wherein the power source functions as a pulse generator configured to output pulses separated by reset periods.

13. The PNRD according to claim 1, further comprising the power source and a refrigerator operable to cool the branches to temperatures at which they are superconductors, wherein the power source is located outside of a volume cooled by the refrigerator.

14. The PNRD according to claim 1, further comprising the power source and one or more filters, wherein the power source comprises a digital to analog converter (DAC) controlled by a controller, and the one or more filters are connected to filter an output of the DAC.

15. The PNRD according to claim 1, comprising a controller connectable to obtain, from the current monitor, measurements of the electrical current at first and second times that are respectively before and after photons are delivered to the PNRD and to calculate a number N of the photons by processing a difference between the measurements of the electrical current.

16. The PNRD according to claim 15, wherein the controller is configured to obtain additional measurements of the electrical current at one or more times while photons are being detected and to calculate the number of photons based at least in part on the additional measurements.

17. The PNRD according to claim 15, wherein the controller is configured to reset the PNRD by interrupting a supply of electrical current from the power source to the branches for a time long enough to allow all of the nanowires to cool to a temperature at which they are superconducting.

18. The PNRD according claim 1, wherein the branches of the PNRD are divided into plural groups, the branches of each of the groups are connected in parallel, and the PNRD is connectable to a power supply and current monitor for each of the plural groups.

19. The PNRD according to claim 1, wherein the power supply is configured to output a pulsed voltage, and each electrically resistive component is controllable to adjust a bias current in the corresponding branch.

20. A photon number resolving detector (PNRD) comprising:
a waveguide having an optical input connected to receive photons for detection;
multiple nanowires extending transversely across the waveguide at spaced apart locations, each of the nanowires comprising a material that is superconducting at an operating temperature of the PNRD, each of the nanowires connected in series with an electrically resistive component to provide a branch, the branches electrically connected in parallel with one another; and
a controller;
wherein:
the PNRD is connectable to a power source connected to apply a voltage across the branches, and a current monitor to monitor an electrical current drawn from the power source by the branches;
at the operating temperature, an electrical time constant of the nanowire is small enough to cause latching to a latched state when the nanowire absorbs a photon; and
the controller is connectable to obtain, from the current monitor, measurements of the electrical current at first and second times that are respectively before and after photons are delivered to the PNRD and is configured to calculate a number N of the photons based on a difference between the measurements of the electrical current by computing:

$$N = \frac{I_{START} - I_{MEASURE}}{\Delta I}$$

where $I_{START}$ is the measured electrical current at the first time, $I_{MEASURE}$ is the measured electrical current at the second time and $\Delta I$ is given by: $\Delta I = I_{BIAS} - I_{LATCH}$ where $I_{BIAS}$ is a bias current for one of the nanowires in an unlatched state and $I_{LATCH}$ is a current in the one of the nanowires when the nanowire is in the latched state.

21. A method for detecting and counting photons, the method comprising:
cooling a waveguide having multiple nanowires extending transversely across the waveguide at spaced apart locations to a temperature at which the nanowires are superconducting;
passing a bias current through each of the nanowires wherein the bias current is lower than a critical current for the nanowire;
directing at least one photon into the waveguide and allowing the photon to be evanescently absorbed by one of the nanowires;
upon the one of the nanowires absorbing the photon, latching the nanowire in a resistive state;
measuring an aggregate electrical current drawn by the nanowires and processing the measured aggregate current to count the photon.

* * * * *